(12) United States Patent
Takano

(10) Patent No.: US 9,679,976 B2
(45) Date of Patent: *Jun. 13, 2017

(54) SEMICONDUCTOR DEVICE AND METHOD OF MANUFACTURING THE SAME

(71) Applicant: KABUSHIKI KAISHA TOSHIBA, Tokyo (JP)

(72) Inventor: Masamune Takano, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/226,291

(22) Filed: Aug. 2, 2016

(65) Prior Publication Data

US 2016/0343812 A1 Nov. 24, 2016

Related U.S. Application Data

(62) Division of application No. 15/018,491, filed on Feb. 8, 2016, now Pat. No. 9,437,695, which is a division
(Continued)

(30) Foreign Application Priority Data

Sep. 12, 2013 (JP) .................................. 2013-189428

(51) Int. Cl.
*H01L 29/423* (2006.01)
*H01L 29/417* (2006.01)
(Continued)

(52) U.S. Cl.
CPC ...... *H01L 29/41708* (2013.01); *H01L 21/266* (2013.01); *H01L 21/283* (2013.01); *H01L 21/2855* (2013.01); *H01L 29/0834* (2013.01); *H01L 29/1095* (2013.01); *H01L 29/42304* (2013.01); *H01L 29/66106* (2013.01);
(Continued)

(58) Field of Classification Search
CPC ........... H01L 29/42304; H01L 29/7393; H01L 29/66106; H01L 29/7397; H01L 29/0834
See application file for complete search history.

(56) References Cited

U.S. PATENT DOCUMENTS 6,900,476 B2 5/2005 Steubel et al.
7,015,513 B2 3/2006 Hsieh
(Continued)

FOREIGN PATENT DOCUMENTS

JP S59220937 A 12/1984
JP H04293268 A 10/1992
(Continued)

OTHER PUBLICATIONS

Japanese Office Action dated Mar. 24, 2016, filed in Japanese counterpart Application No. 2013-189428, 18 pages (with translation).
(Continued)

*Primary Examiner* — Douglas Menz
(74) *Attorney, Agent, or Firm* — Patterson & Sheridan, LLP

(57) ABSTRACT

According to one embodiment, a semiconductor device includes a semiconductor substrate in which a recess is provided on a back surface thereof, and a shape of the recess is reflected on a surface of a metal film which is also provided on the back surface of the semiconductor substrate.

18 Claims, 8 Drawing Sheets

Related U.S. Application Data of application No. 14/194,389, filed on Feb. 28, 2014, now Pat. No. 9,263,534.

(51) Int. Cl.
| | |
|---|---|
| *H01L 29/739* | (2006.01) |
| *H01L 21/283* | (2006.01) |
| *H01L 21/266* | (2006.01) |
| *H01L 29/66* | (2006.01) |
| *H01L 29/08* | (2006.01) |
| *H01L 21/285* | (2006.01) |
| *H01L 29/10* | (2006.01) |

(52) U.S. Cl.
CPC .. *H01L 29/66113* (2013.01); *H01L 29/66348* (2013.01); *H01L 29/7393* (2013.01); *H01L 29/7397* (2013.01)

(56) References Cited

U.S. PATENT DOCUMENTS

| | | |
|---|---|---|
| 8,299,501 B2 | 10/2012 | Watanabe et al. |
| 2004/0119084 A1 | 6/2004 | Hsieh et al. |
| 2008/0273562 A1 | 11/2008 | Hasegawa et al. |

FOREIGN PATENT DOCUMENTS

| | | |
|---|---|---|
| JP | H0620984 A | 1/1994 |
| JP | 2006-020984 A | 1/2006 |
| JP | 2009049277 A | 3/2009 |
| WO | 2006123580 A1 | 11/2006 |

OTHER PUBLICATIONS

Japanese Office Action dated Jul. 4, 2016, filed in Japanese counterpart Application No. 2013-189428, 8 pages (with translation).

SEMICONDUCTOR DEVICE AND METHOD OF MANUFACTURING THE SAME

CROSS-REFERENCE TO RELATED APPLICATION

This application is a division of U.S. patent application Ser. No. 15/018,491, filed on Feb. 8, 2016, which is a division of U.S. patent application Ser. No. 14/194,389, filed on Feb. 28, 2014, now U.S. Pat. No. 9,263,534, issued on Feb. 16, 2016, which is based upon and claims the benefit of priority from Japanese Patent Application No. 2013-189428, filed Sep. 12, 2013, the entire contents of each of which are incorporated herein by reference.

FIELD

Embodiments described herein relate generally to a semiconductor device and a method of manufacturing the same.

BACKGROUND

A metal film is formed on a back surface of a semiconductor substrate and is used as an electrode in a semiconductor device for power connection to the device. However, there is a case where an internal stress is generated in the metal film, and this stress may result in the metal film peeling off from the semiconductor substrate resulting in an inability to power and use the device.

DETAILED DESCRIPTION

Embodiments provide a semiconductor device having good adhesion between a semiconductor substrate and a metal film and a method of manufacturing the same.

In general, according to one embodiment, there is provided a semiconductor device including a semiconductor substrate in which recesses or grooves are formed on a back surface of the substrate and a metal film is provided on the back surface of the semiconductor substrate and the metal film conformally covers the shape of the recesses or grooves.

According to another embodiment, there is provided a method of manufacturing a semiconductor device including forming a resist pattern on a back surface of a semiconductor substrate, forming a recess on the back surface of the semiconductor substrate by performing etching of the substrate using the resist pattern as a mask, removing the resist pattern, and forming a metal film on the back surface of the substrate.

Hereinafter, exemplary embodiments will be described with reference to drawings.

First, description will be given with regard to a first embodiment.

Figure 1A:
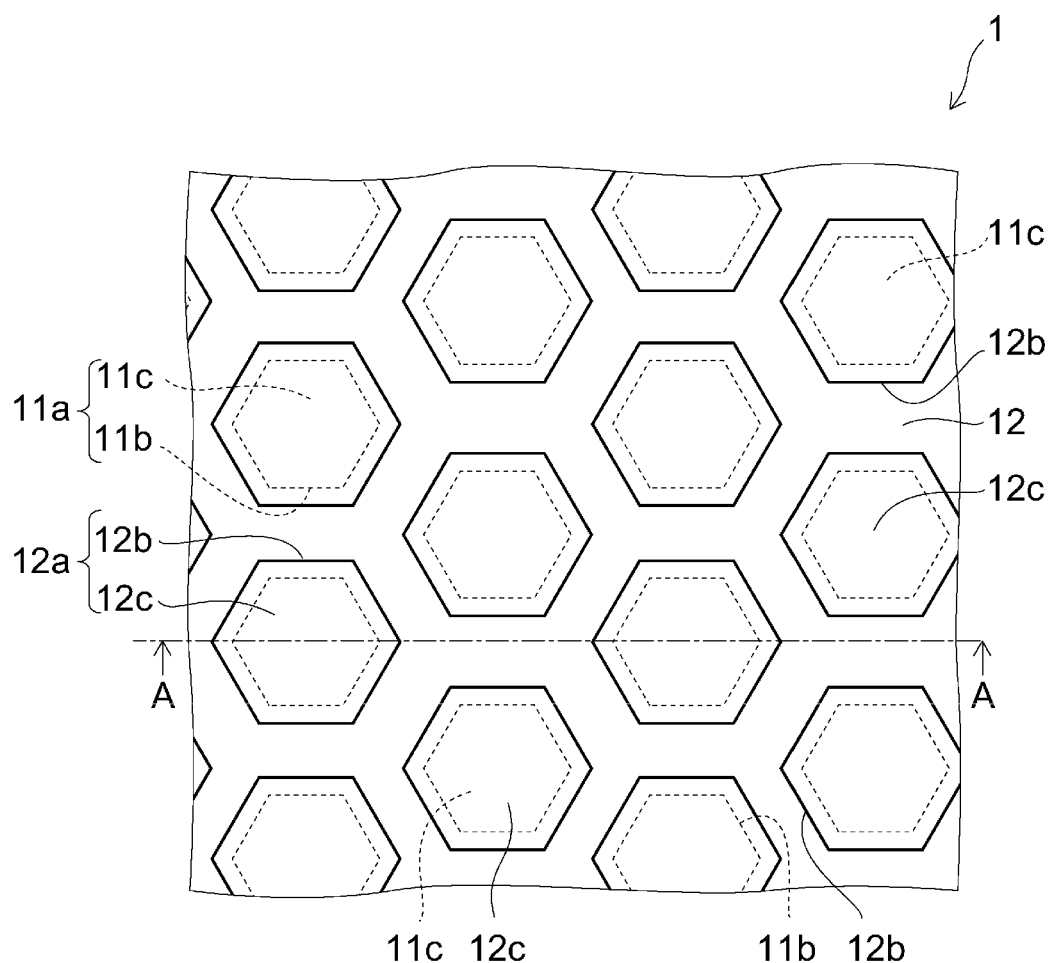
FIG. 1A is a plan view of the back surface of a semiconductor device according to a first embodiment.
Figure 1B:
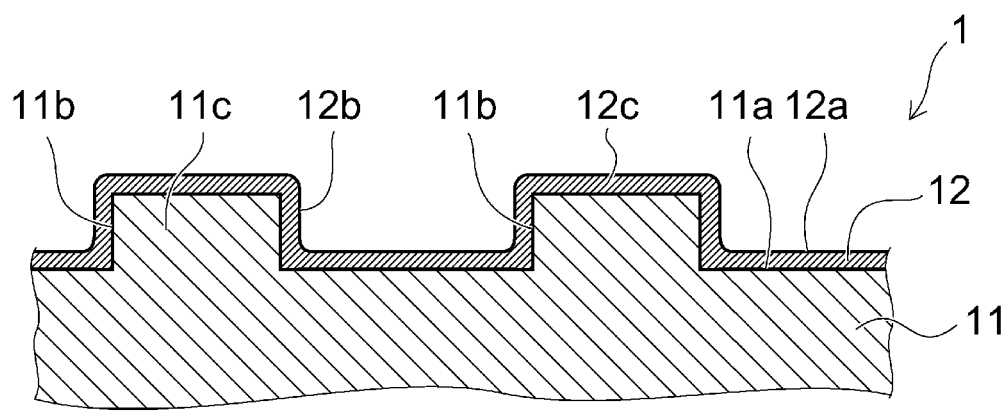
FIG. 1B is a partial sectional view of the device of FIG. 1A at line A-A'.

FIG. 1A is a plan view of the back surface of a semiconductor device according to a first embodiment, and FIG. 1B is a partial sectional view of the device of FIG. 1A at line A-A'.

As shown in FIGS. 1A and 1B, a silicon substrate 11 is provided in a semiconductor device 1 according to an embodiment. A device side structure (not shown) such as a dopant diffusion layer and electrode are formed on a surface layer portion and a surface of the silicon substrate 11.

Recesses 11b are formed on an entire surface of a back surface 11a of the silicon substrate 11 such that in the region between the recesses 11b a projecting portion 11c of the substrate remains. The resulting pattern of recesses 11b and projecting portions 11c are in the pattern of a honeycomb. The recesses may be considered as one continuous recess with intermediate projecting portions extending therefrom in a repeating pattern. In other words, as viewed from the back surface 11c side of the silicon substrate 11, the shape of the projecting portions 11c are hexagonal and the shape of the recesses 11b are mesh-shaped, and the recesses 11b surround the hexagonally shaped projecting portions 11c. The recesses 11b extend to the edge (not shown) of the silicon substrate 11. A depth of the recesses 11b are, for example, 1 μm to 10 μm. In addition, the widths of the recesses 11b (between adjacent extending portions 11c) are, for example, several μm to several tens of μm. The hexagonal projecting portions 11c are provided by patterning the resist of FIG. 2C to include individual islands of resist 53 having a hexagonal perimeter, such that the spaces between the resist 523 islands are formed as three groups of spaced parallel grooves extending through the resist to expose the underlying back surface of the semiconductor wafer 11, and the groups of parallel lines are disposed at an angle of approximately 120 degrees to each other. As a result, adjacent sides of two different hexagonal projecting portions 11c which are protected from the etchant by the resist, are parallel to each other.

In addition, a metal film 12 is formed on the entire surface of the back surface 11a of the silicon substrate 11. The metal film 12 is, for example, formed of metal materials such as aluminum, an aluminum-silicon alloy, and titanium. A thickness of the metal film 12 is, for example, approximately 1 μm. The metal film 12 is conformal, such that a recessed portion 12b is formed between the projecting portions 11c of the, following the shape of the recessed portion 11b of the silicon substrate 11. The portion of the metal film 12 extending between the recessed portions 12a thereof forms a projecting portion 12c, and a sidewall portion 12 b extends along the sides of the projecting portions 11c of the substrate, to yield a conformal, continuous metal film 12. The metal film 12 is formed on the entire back surface of the semiconductor device 1 and extends to the edge of the semiconductor device 1.

The semiconductor device 1 is, for example, a vertical-type semiconductor device for power, and for example, is an insulated gate bipolar transistor (IGBT). In such a device, the metal film 12 is the back surface side electrode of the semiconductor device 1. The semiconductor device 1 is joined to an external member via solder by applying and heating a solder paste between the metal film 12 and lead frame (not shown), when the IGBT is mounted to the lead frame.

Next, description will be given with regard to a method of manufacturing the semiconductor device according to the embodiment.

FIGS. 2A to 2C and FIGS. 3A to 3C are sectional views of a portion of the silicon substrate 11 illustrating steps of a method of manufacturing the semiconductor device according to the embodiment.

Figure 2A:
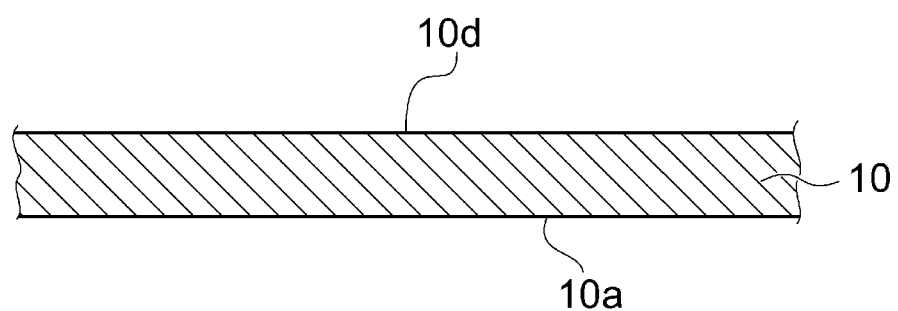
FIGS. 2A to 2C are cross-sectional views of a semiconductor device illustrating a method of manufacturing a backside contact for the semiconductor device according to the first embodiment.

First, as shown in FIG. 2A, a silicon wafer 10 is provided. Then, the surface side device structure (not shown) such as the dopant diffusion layer and the surface side electrode are formed on a surface 10d of the silicon wafer 10.

Figure 2B:
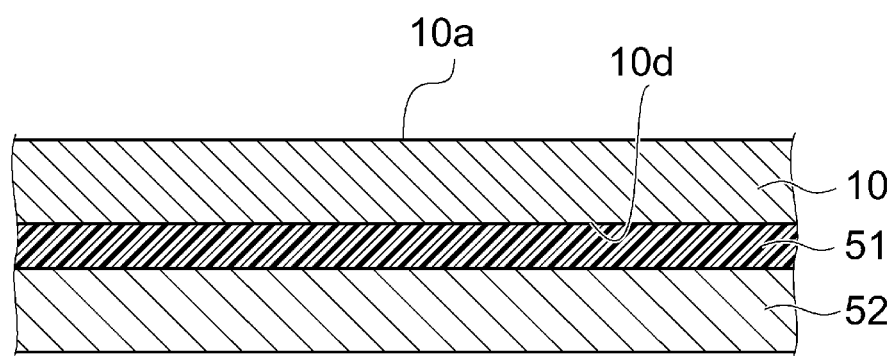

Next, as shown in FIG. 2B, the silicon wafer 10 is attached to a supporting substrate 52 by applying an adhesive 51 to the surface 10d of the silicon wafer 10. As a result, the back surface 10a of the silicon wafer 10 is exposed for processing thereof. A resist material may be used in the adhesive 51. Next, the silicon wafer 10 is thinned by grinding the back surface 10a of the silicon wafer 10. The thickness of the silicon wafer 10 after the grinding of the back surface is selected based upon the desired withstand voltage and on-resistance of the semiconductor device 1, and for example, is approximately several tens of μm to 100 μm.

Figure 2C:
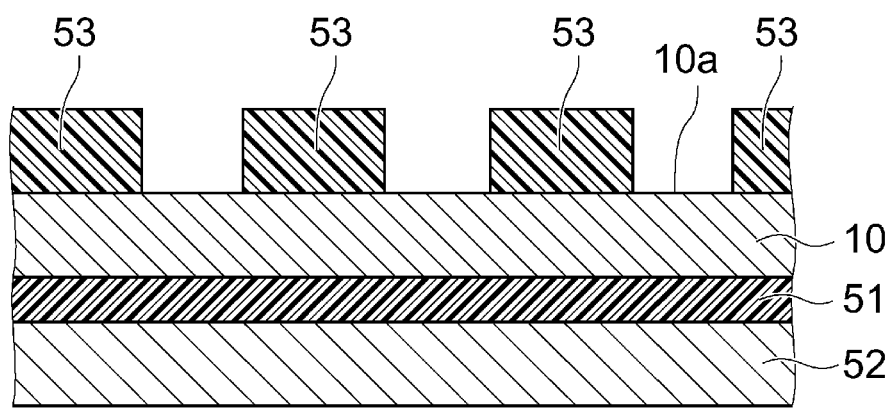

Next, as shown in FIG. 2C, a patterned resist is formed on the back surface 10a of the silicon wafer 10. The pattern 53 of the patterned resist is a pattern of hexagons spaced from one another along three directions to form a plurality of hexagonal prism-shaped and island-shaped portions in a honeycomb pattern. In addition, the pattern 53 extends to the edge (not shown) of the silicon wafer 10.

Figure 3A:
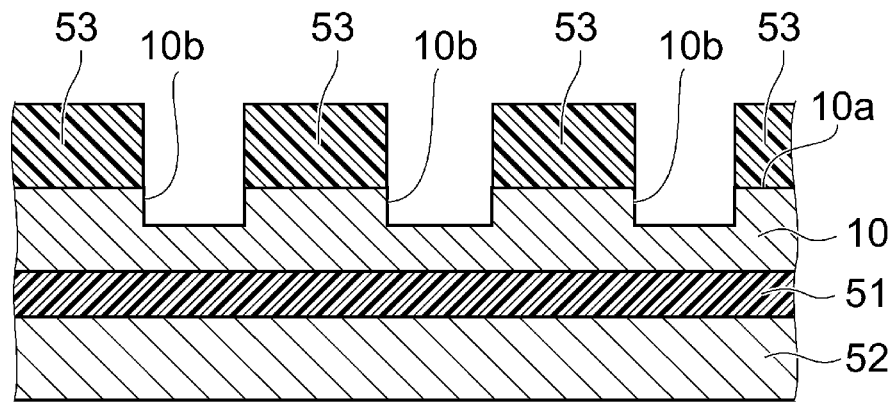
FIGS. 3A to 3C are further cross-sectional views of a semiconductor device illustrating a method of manufacturing a backside contact for the semiconductor device according to the first embodiment.

Next, etching is performed on the silicon wafer 10 using the resist pattern 53 as a mask resulting in the structure shown in FIG. 3A. For the etching step, wet etching may be performed or dry etching may be performed. As a result, the portion of the silicon wafer 10 not covered by the pattern 53 of the resist is selectively removed in the back surface side portion of the silicon wafer 10, and the recesses 10b are thus formed on the back surface 10a. The recesses 10b interconnect to form three groupings of spaced, parallel groups, each group offset from the other sets by an angle of approximately 120 degrees, resulting in hexagonal projecting portions 11c extending upwardly from the surface of the substrate 10 bounded by the recesses 11b. The depth of the recesses 10b is, for example, 1 μm to 10 μm. The portions between the grooves 10b in the back surface 10a are the projecting portions 10c. In addition, an annular extending portion (not shown) is formed at the edge of the back surface side of the silicon wafer 10. The width of the projecting portions is, for example, 1 mm to 2 mm. By forming the pattern of recesses and projecting portions, warpage of the silicon wafer 10 caused by differences in the coefficient of thermal expansion of the metal film to be applied on the pattern, and the silicon wafer 10, is suppressed.

Figure 3B:
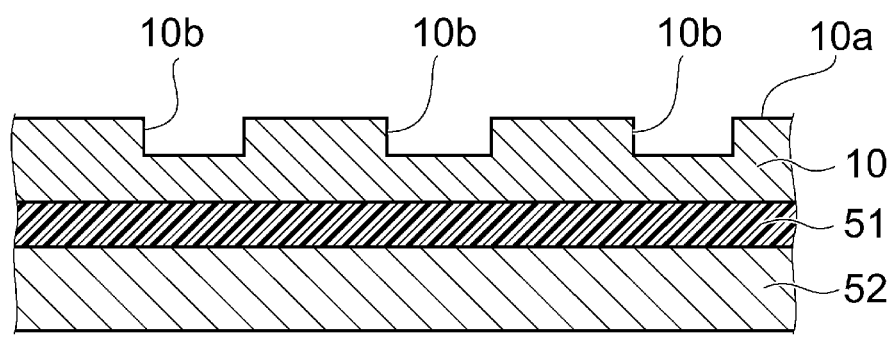

Next, ashing is performed to remove the resist pattern 53, as shown in FIG. 3B. Next, pretreatment is performed to the back surface 10a of the silicon wafer 10 by wet processing.

Figure 3C:
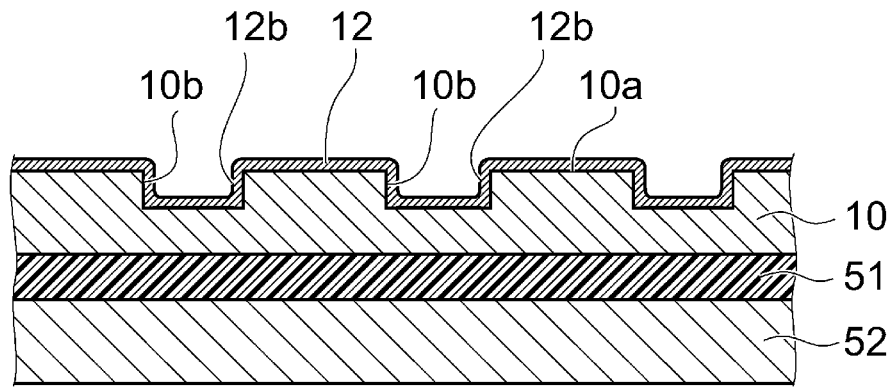

Next, metal is deposited on the back surface 10a of the silicon wafer 10 by sputtering, resulting in the conformal metal film 12 covering the pattern of recesses 11b and projecting portion c as shown in FIG. 3C. The thickness of the metal film 12 is, for example, 1 μm. A portion of the metal film 12 is formed on the surfaces of the recesses 11b. The recessed portion 12b and the projecting portion 12c of the metal film 12 follow the pattern of the shapes of the recesses 11b and projecting portions 11c.

Next, dicing is performed on the silicon wafer 10 to cut the silicon wafer 10 having the metal film 12 formed thereon into a plurality of individual device sized silicon substrates 11, and thereby the semiconductor device 1 is manufactured. The dicing line traverses the recessed portions 10b along a continuous line from edge to edge of the substrate 10, and thus a recessed portion 11b, 12b is present at the edges of the device substrates 11 of the semiconductor devices 1.

Next, description will be given with regard to the effects of the embodiment.

Since the recesses 11b are formed on the back surface 11a of the silicon substrate 11 as continuous straight lines, the contact area between the silicon substrate 11 and the metal film 12 is large, in the semiconductor device 1 according to the embodiment. I.e., the surface area of the back side of the substrate, including the side walls of the recesses, is larger than a substrate without the recesses 11 etched therein. In addition, an anchoring effect can be obtained by the presence of the metal film 12 within the recesses 11b. As a result, the adhesion between the silicon substrate 11 and the metal film 12 is increased, and peeling of the metal film 12 from the silicon substrate 11 is inhibited. In addition, since the contact area between the silicon substrate 11 and the metal film 12 is larger, the electrical contact resistance between the silicon substrate 11 and the metal film 12 is smaller as compared to a non-recessed substrate 10 or wafer 11. As a result, the on-current of the semiconductor device 1 is greater.

The semiconductor device 1 is mounted to an external member such as a lead frame with solder applied between the metal film 12 and the lead frame (not shown). During the soldering process, solder enters the recesses 12b of the metal film 122. As a result, the contact area between the metal film 12 and the solder is increased, and the contact resistance therebetween is decreased while the solder is more strongly joined to the substrate 11. In addition, it is possible to realize an anchoring effect by the solder entering the groove 12b. Then, in the embodiment, since the recesses 12b are formed as continuous grooves on the back surface of the wafer 11 (and substrate 10), when the solder paste is applied, air can escape along the length of the groove and voids formed by entrained air will be inhibited between the metal film 12 and the solder. As a result, while the adhesion between the metal film 12 and the solder are more definitely improved, the contact resistance is also more definitely reduced.

It is preferable that the depth of the recesses 11b formed on the silicon substrate 11 be set to 1 μm to 10 μm. Since the thickness of the metal film 12 is approximately 1 μm, it is possible to reflect the shape of the recesses 11b in the profile of the surface 12a of the metal film 12 by setting the depth of the groove 11b to 1 μm or more, where the depth of the recesses 11b is 1 μm to 10 μm. As a result, as described above, while the contact area between the metal film 12 and the solder are increased, the anchor effect can be obtained. In addition, it is possible to prevent the surface side device structure formed on the surface of the silicon substrate 11 from being affected by the etching of the recesses 11b, and it is possible to prevent the silicon substrate 11 from being broken with the recesses 11b becoming a fracture starting point by setting the depth of the groove 11b to 10 μm or less.

Next, description will be given with regard to a second embodiment.

Figure 4:
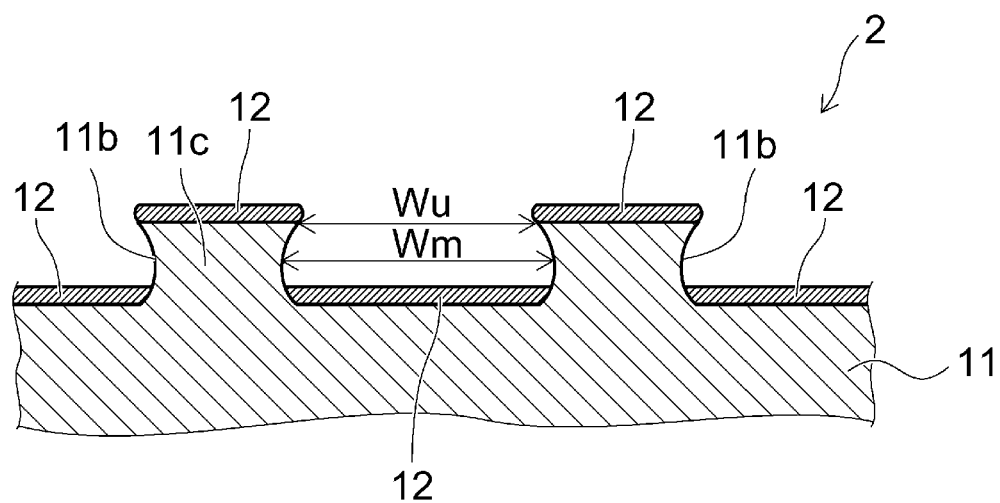
FIG. 4 is a partial sectional view of a semiconductor device illustrating a backside contact for a semiconductor device according to a second embodiment.

FIG. 4 is a partial-sectional view illustrating a semiconductor device according to the embodiment.

As shown in FIG. 4, a semiconductor device 2 according to the embodiment is different from the first embodiment of FIGS. 1A and 1B in that the sidewalls of the projecting portions (which also form the sidewall boundaries of the recessed portions) are undercut, such that a width Wm of a recessed portion sidewall at the mid-point of the depth of the recessed portion 11b is wider than a width Wu at the top of the recess 11b or projecting portion 11c sidewall. The metal film 12 is formed on the top surface of the convex portion 11c or a base of the recessed portions 11b, but is not formed on a side surface of the recessed portions 11b. For this reason, the metal film 12 is discontinuous on the side surface of the recessed portions 11b.

As described above, it is possible to form the recessed portions 11b in which the side surface thereof extends inwardly of the projecting portions 11c as shown in FIG. 3A by performing isotropic etching, for example, wet etching. In addition, it is possible to form the metal film 12 divided on the side surfaces of the recessed portions 11b in the process shown in FIG. 3C by depositing metal with low conformality which results in exposed sidewalls of the recessed portions 11b/projecting portions 11c, such as by a directional sputtering process wherein the sputtered metal flux used to form the metal film 12 travels to the substrate in a direction generally perpendicular to the base of the recessed portions 11b and the tops of the projection portions 11c.

According to the embodiment, since the metal film 12 is discontinuous, large thermally induced stress does not occur in the metal film 12. As a result, the metal film 12 does not easily peel from the substrate 11 as a result of the difference in the coefficient of thermal expansion of the metal film 12 and substrate 11. Other configurations, manufacturing methods, and effects in the embodiment are the same as the above-described first embodiment.

Next, description will be given with regard to a third embodiment.

Figure 5:
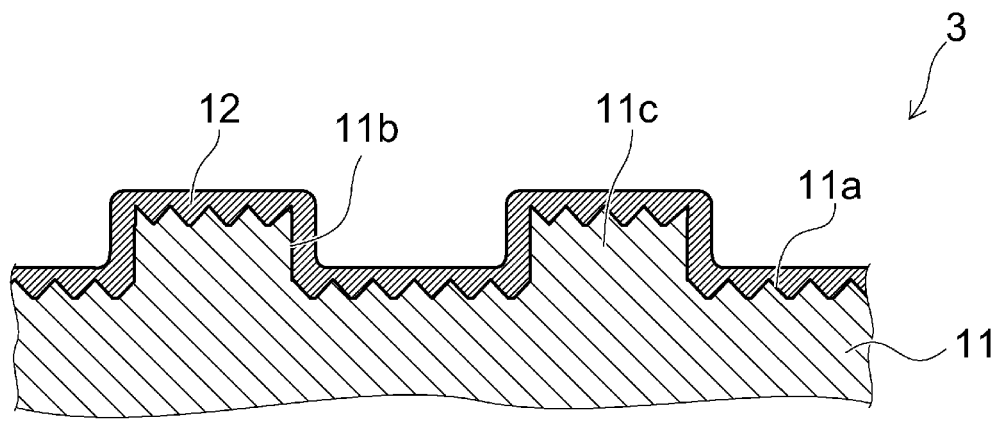
FIG. 5 is a partial sectional view of a semiconductor device illustrating a backside contact for a semiconductor device according to a third embodiment.

FIG. 5 is a partial sectional view illustrating a semiconductor device according to the embodiment.

As shown in FIG. 5, a semiconductor device 3 according to the embodiment is different in the point that fine irregularities are formed on the back surface 11a of the silicon substrate 11, as compared to the semiconductor device 1 (refer to FIGS. 1A and 1B) according to the above-described first embodiment. A pitch of the irregularities is smaller than the width of the recessed portions 11b, for example, for example approximately several hundreds of nm. The fine irregularities may be formed only on the bottom surface of the recessed portions 11b and the top surface of the projecting portions 11c and may be also formed on the side surface of the recessed portions. Then, the metal film 12 is conformally formed so as to cover the irregularities.

It is possible to form such irregularities by performing surface-roughening treatment on the back surface 10a of the silicon wafer 10 after the process of forming the recesses 10b shown in FIG. 3B. Examples of surface-roughening treatments include wet processing by chemicals such as sulfuric acid and "grit" blasting which impinges fine grains into the back surface 10a to erode the surface into the pattern shown in FIG. 5.

According to the embodiment, it is possible to further increase the contact area between the silicon substrate 11, and the metal film 12 by forming fine irregularities on the back surface 11a of the silicon substrate 11. As a result, it is possible to further improve the adhesion between the silicon substrate 11 and the metal film 12, and simultaneously further decrease the contact resistance between the silicon substrate 11 and the metal film 12 because the irregularities increase the surface area for contact between the back side of the substrate 11 and the metal film 12. Other configurations, manufacturing methods, and effects in the embodiment are the same as the above-described first embodiment.

Next, description will be given with regard to a fourth embodiment.

Figure 6:
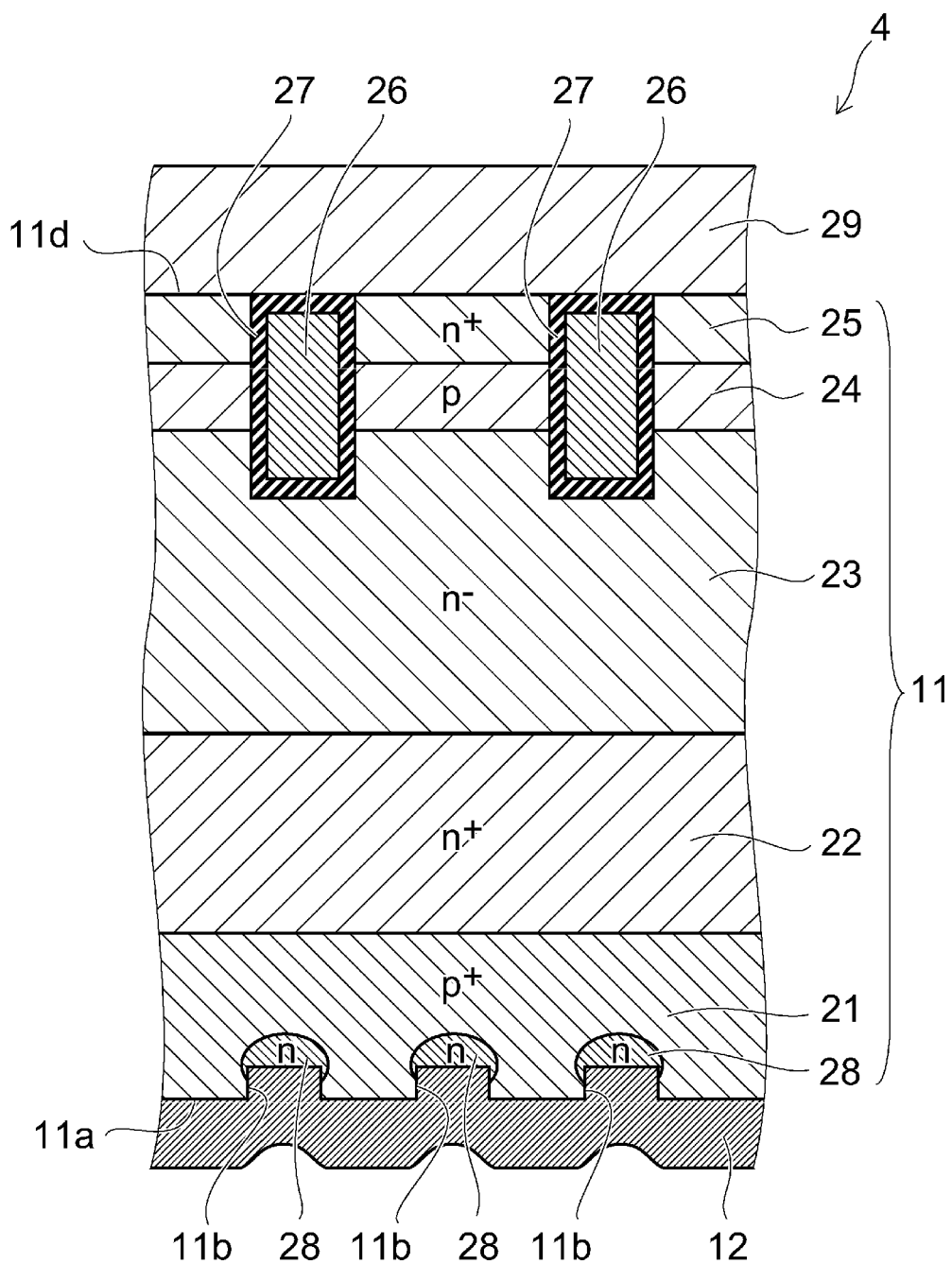
FIG. 6 is a cross-sectional view of a semiconductor device according to a fourth embodiment, showing a device region and backside contact region.

FIG. 6 is a cross-sectional view illustrating a semiconductor device according to the embodiment.

Moreover, in FIG. 6, a front and a back therein are reversed with respect to the above-described partial sectional views, for example those of FIG. 1B, FIG. 4 and FIG. 5.

As shown in FIG. 6, a semiconductor device 4 according to the embodiment is an IGBT. In the semiconductor device 4, a p+ type collector layer 21, an n+ type buffer layer 22, an n-type bulk layer 23, a p type base layer 24, and an n+ type emitter layer 25 are formed in the silicon substrate 11, in order from the back surface 11a side of the wafer 11. In addition, a trench gate electrode 26 is provided so as to pass through the n+ type emitter layer 25 and the p type base layer 24 and extend into, and terminate within, the n-type bulk layer 23 from the surface 11d side of the silicon substrate 11. The trench gate electrode 26 is a base electrode of the semiconductor device 4. For example, a gate insulating film 27 including silicon oxide is provided around the trench gate electrode 26. A surface side electrode film 29 is provided on the surface 11d of the silicon wafer 11 and is connected to the n+ type emitter layer 25.

The recesses 11b are formed on the bottom surface of the p+ type collector layer 21. Accordingly, the projecting portions 11c are formed by the p+ type collector layer 21. Then, an n+ type cathode layer 28, in which conductivity type is n+ type, is formed at a portion which is in contact with the bottom surface of the recesses 11b in the p+ type collector layer 21. For this reason, the metal film 12 is in contact with both the p+ type collector layer 21 and the n+ type cathode layer 28.

Next, description will be given with regard to a method of manufacturing the semiconductor device according to the embodiment.

Figure 7:
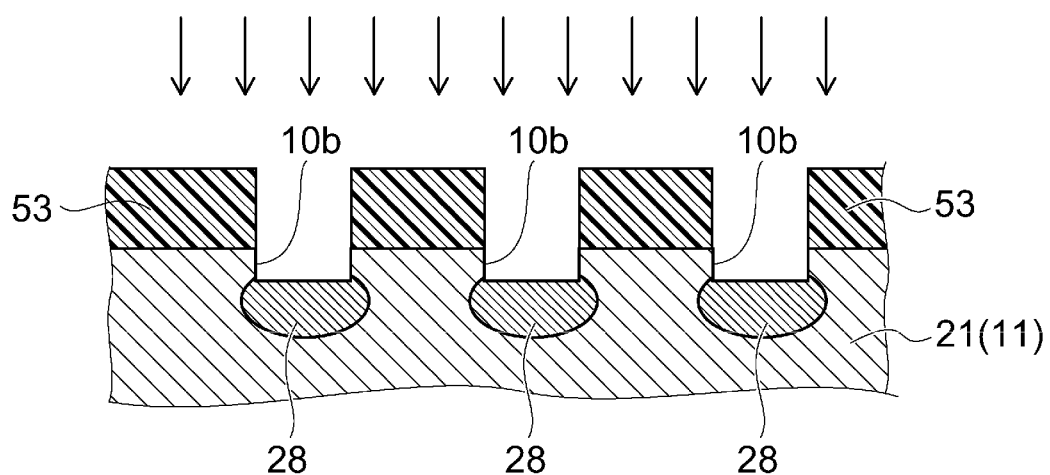
FIG. 7 is a partial sectional view of a semiconductor device during the process of manufacturing the backside contact of the semiconductor device according to the fourth embodiment.

FIG. 7 is a process cross-sectional view illustrating a method of manufacturing the semiconductor device according to the embodiment.

Hereinafter, description will be given with reference to FIG. 6, FIG. 7, FIGS. 2A to 2C, and FIGS. 3A to 3C.

First, as shown in FIG. 6 and FIG. 2A, an n-type silicon wafer 10 is provided. Then, the p type base layer 24, the n+ type emitter layer 25, the gate insulating film 27, the trench gate electrode 26, and the surface side electrode film 29 are formed as the surface side device structures as shown in FIG. 6.

Next, the silicon wafer 10 is thinned by attaching the surface 10d of the silicon wafer 10 on the supporting substrate 52 through the adhesive 51 as shown in FIG. 2B and grinding the back surface 10a of the silicon wafer 10. Then, the n+ type buffer layer 22 and the p+ type collector layer 21 are formed. A portion between the p type base layer 24 and the n+ type buffer layer 22 is the n-type bulk layer 23.

Next, a resist pattern 53 is formed on the back surface 10a of the silicon wafer 10 as shown in FIG. 2C.

Next, the recessed portions 10b are formed on the back surface 10a of the silicon wafer 10 as shown in FIG. 3A by performing the etching by using the resist pattern 53 as the mask.

Next, as shown in FIG. 7, n type dopants are ion-implanted into the p+ layer 23 while the resist pattern 53 remains in place. As a result, the n+ type cathode layer 28 is formed at a portion of the wafer 11 in contact with the bottom surface of the recesses 10b in the p+ type collector layer 21.

Next, as shown in FIG. 3B the resist pattern 53 is removed as shown in FIG. 3B such as by ashing, and wet processing is performed to clean the semiconductor wafer 11.

Next, the metal film 12 is formed on the back surface 10a of the silicon wafer 10 by depositing metal by sputtering resulting in the structure shown in as shown in FIG. 6 and FIG. 3C. A portion of the metal film 12 enters the recessed portion to contact both the p+ type collector layer 21 and the n+ type cathode layer 28. In this manner, the semiconductor device 4 is manufactured.

Next, description will be given with regard to the effects of the embodiment.

In the embodiment, it is possible to make a fast recovery diode (FRD) in the IGBT by forming the n+ type cathode layer 28 in the p+ type collector layer 21. That is, it is possible to form a circuit in which the IGBT and the FRD are connected in parallel in one chip. In addition, since it is possible to form the n+ type cathode layer 28 using the resist pattern 53 for forming the groove 10b, in the number of processes is reduced by the formation of the n+ type cathode layer 28 with the same resist used for etching, and it is possible to reduce manufacturing cost. Other configurations, manufacturing methods, and effects in the embodiment are the same as the above-described first embodiment.

Next, description will be given with regard to a fifth embodiment.

Figure 8A:
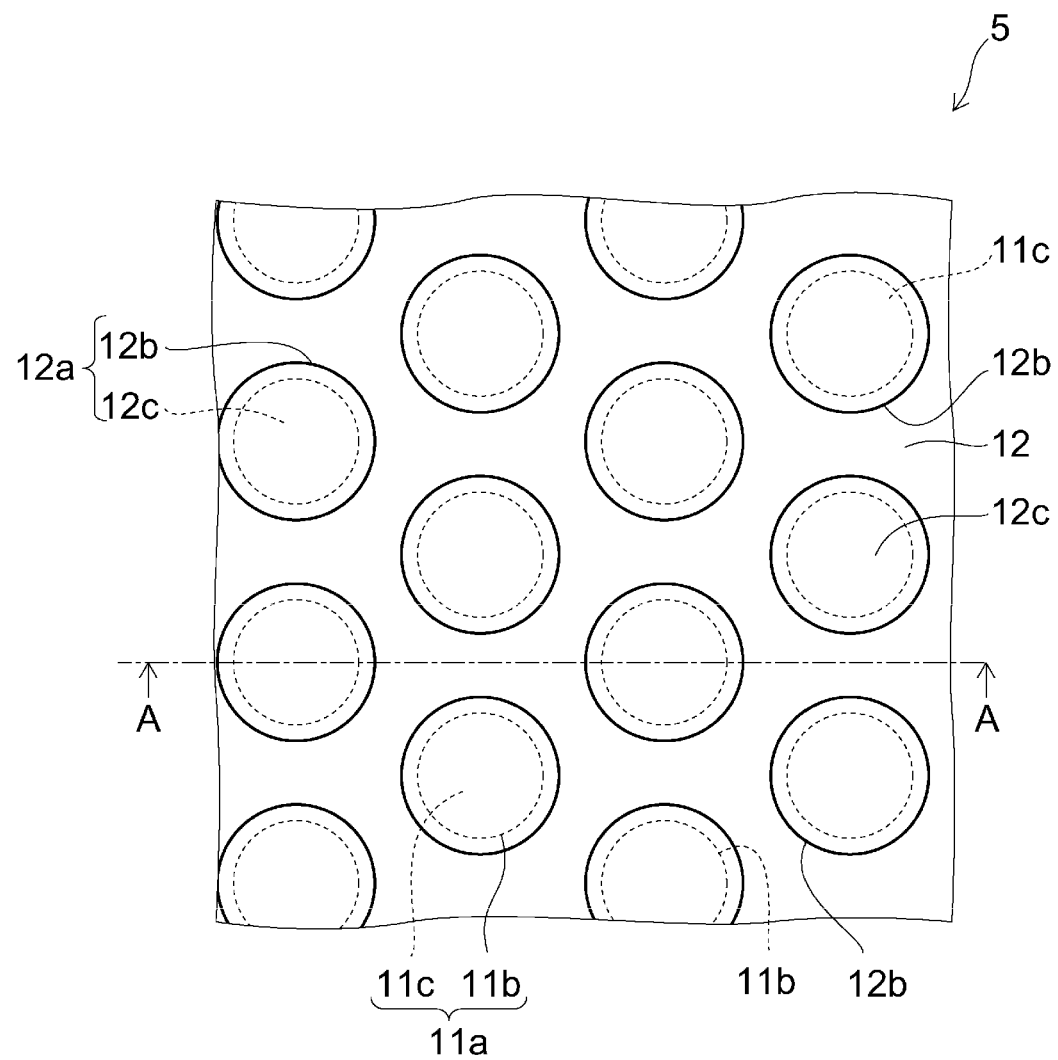
FIG. 8A is a plan view of the back surface of a semiconductor device according to a fifth embodiment.
Figure 8B:
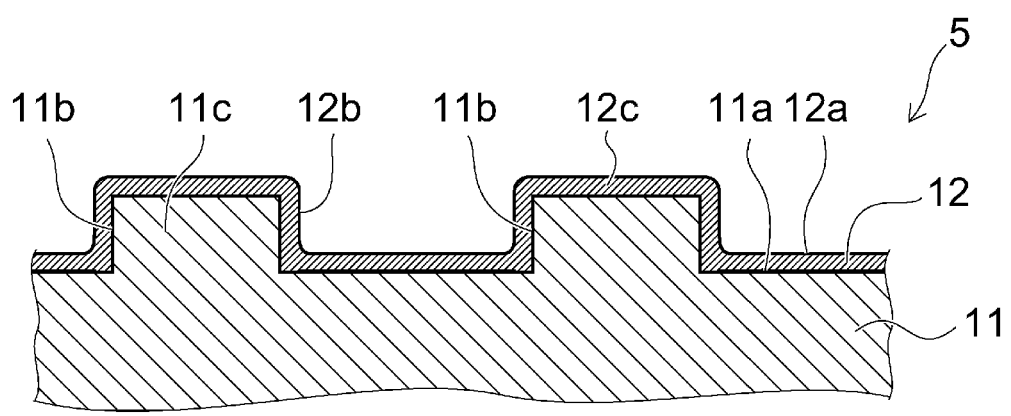
FIG. 8B is a sectional view taken along a line A-A' of in FIG. 8A.

FIG. 8A is a back surface view illustrating a semiconductor device according to the embodiment, and FIG. 8B is a cross-sectional view taken along an A-A' line shown in FIG. 8A.

As shown in FIGS. 8A and 8B, a semiconductor device 5 according to the embodiment is different in the point that the shape of the projecting portions 11c formed in the silicon substrate 11 are circular in section, forming projecting cylinders, as compared with the semiconductor device 1 (refer to FIGS. 1A and 1B) according to the above-described first embodiment. The cylinders are left as projecting portions 11c during the etching of the recessed portions 11b, because they are protected from the etchant by the resist 53. As with the hexagonal projecting portions 11c, the cylindrical projecting portions 11c are also formed in a repeating pattern.

According to the embodiment, for example, as described in the above-described fourth embodiment, since a corner is not formed at an interface between the p+ type collector layer 21 and the n+ type cathode layer 28, when the n+ type cathode layer 28 is formed in the p+ type collector layer 21 by using the semiconductor device 5 as the IGBT, it is possible to reduce the concentration of an electric field at the interface thereof. Other configurations, manufacturing methods, and effects in the embodiment are the same as the above-described first embodiment.

According to the above-described embodiment, it is possible to realize a semiconductor device in which the adhesion between the semiconductor substrate and the metal film is excellent and a method of manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate having a recess extending from a surface of the semiconductor substrate in a depth direction to a recessed surface at a recessed depth, the recess being adjacent to an unrecessed portion of the semiconductor substrate, and the semiconductor substrate having a first semiconductor region of a first conductivity type; and
a metal film provided on the surface of the semiconductor substrate on the unrecessed portion and on the recessed surface, wherein
a second semiconductor region of a second conductivity type is provided at the recessed surface, and the second semiconductor region is contacting the metal film at the recessed surface.

2. The device according to claim 1,
wherein the recess includes sidewalls extending from the recessed surface to the surface of the semiconductor substrate.

3. The device according to claim 2,
wherein the metal film is in contact with the recessed surface and the sidewalls.

4. The device of claim 1, further including an insulated gate bipolar transistor.

5. The device of claim 1, wherein the shape of the unrecessed portion has a circular shape within a plane parallel to the surface of the semiconductor substrate.

6. The device of claim 1, wherein the shape of the unrecessed portion has a hexagonal shape within a plane parallel to the surface of the semiconductor substrate.

7. The device of claim 1, wherein the recessed depth is 1 μm to 10 μm from the surface of the semiconductor substrate in the depth direction.

8. The device of claim 1, wherein the unrecessed portion has a width of at least 3 μm along a direction parallel to the surface of the semiconductor substrate.

9. The device of claim 1, wherein the first conductivity type is a p-type, and the second conductivity type is an n-type.

10. A semiconductor device, comprising:
a semiconductor substrate having a first side and a second side;
a trench gate electrode formed in the semiconductor substrate on the first side;
a first semiconductor region of a first conductivity type in the semiconductor substrate on the second side, and having a recess extending in a depth direction from a first surface of the first semiconductor region to a recessed surface of the first semiconductor region that is at a recessed depth;

a metal film on the first surface and the recessed surface; and a second semiconductor region of a second conductivity type in the semiconductor substrate at the recessed surface and contacting the metal film.

11. The device according to claim 10, wherein the recess includes sidewalls extending from the recessed surface to the first surface.

12. The device according to claim 11, wherein the metal film contacts the recessed surface and the sidewalls.

13. The device of claim 10, further including an insulated gate bipolar transistor.

14. The device of claim 10, wherein the second semiconductor region includes a first portion below the recess in the depth direction, and the first portion has a circular shape within a plane parallel to the first surface.

15. The device of claim 10, wherein the second semiconductor region includes a first portion below the recess in the depth direction, and the first portion has a hexagonal shape within a plane parallel to the first surface.

16. The device of claim 10, wherein the recessed depth is 1 $\mu$m to 10 $\mu$m from the first surface in the depth direction.

17. The device of claim 10, wherein the first portion has a width of at least 3 $\mu$m along a direction parallel to the first surface.

18. The device of claim 10, wherein the first conductivity type is a p-type, and the second conductivity type is an n-type.

* * * * *